United States Patent
Midday et al.

(10) Patent No.: US 10,362,698 B2
(45) Date of Patent: Jul. 23, 2019

(54) METHOD AND SYSTEM FOR ENVIRONMENTAL SEALING OF ELECTRICAL ENCLOSURES

(71) Applicant: Yaskawa America, Inc., Waukegan, IL (US)

(72) Inventors: Jeff Midday, Milwaukee, WI (US); Christian M. Johnson, Milwaukee, WI (US)

(73) Assignee: Yaskawa America, Inc., Waukegan, IL (US)

( * ) Notice: Subject to any disclaimer, the term of this patent is extended or adjusted under 35 U.S.C. 154(b) by 79 days.

(21) Appl. No.: 15/411,481

(22) Filed: Jan. 20, 2017

(65) Prior Publication Data

US 2018/0213667 A1 Jul. 26, 2018

(51) Int. Cl.
| | |
|---|---|
| *H05K 5/00* | (2006.01) |
| *H05K 5/06* | (2006.01) |
| *F16J 15/02* | (2006.01) |
| *H05K 7/18* | (2006.01) |
| *H01B 1/00* | (2006.01) |

(52) U.S. Cl.
CPC ............. *H05K 5/062* (2013.01); *F16J 15/02* (2013.01); *H05K 5/061* (2013.01); *H05K 5/065* (2013.01); *H05K 7/18* (2013.01); *H01B 1/00* (2013.01)

(58) Field of Classification Search
USPC .................................. 427/96.2–96.6; 361/724
See application file for complete search history.

(56) References Cited

U.S. PATENT DOCUMENTS

| | | | | |
|---|---|---|---|---|
| 2,274,106 A | * | 2/1942 | Strong | H02B 1/28 312/100 |
| 4,223,965 A | * | 9/1980 | Palandrani | H02B 1/28 312/100 |
| 6,179,144 B1 | * | 1/2001 | Abroy | H02B 1/28 220/3.2 |
| 6,189,635 B1 | * | 2/2001 | Schuler | B60R 16/04 180/65.1 |

(Continued)

FOREIGN PATENT DOCUMENTS

| | | |
|---|---|---|
| WO | 2015038217 A1 | 3/2015 |
| WO | WO 2015/038217 * | 3/2015 |

OTHER PUBLICATIONS

Tech Section General Technical Data—Hubbell Wiring Device Catalog section 2013 Download from the Internet Feb. 13, 2018—p. 3, para. 3; p. 12, col. 2, Type 3; p. 13, col. 2 Type 6 and Type 13.

*Primary Examiner* — Brian K Talbot
(74) *Attorney, Agent, or Firm* — Wood, Phillips, Katz, Clark & Mortimer

(57) ABSTRACT

As described herein, an electrical enclosure is sealed against environmental contamination. An enclosure cabinet has an interior space. The interior space is accessible through an opening. A door or cover selectively closes the opening. The enclosure cabinet is manufactured of numerous parts and has holes, joints, gaps, seams and/or fasteners. Electrical control devices are mounted in the cabinet. A thick-film elastomeric coating is on an outer surface of the cabinet. The coating has a thickness of at least 0.6 mm to provide a monolithic bridging layer over holes, joints, gaps, seams and/or fasteners to prevent environmental contamination from penetrating the cabinet.

12 Claims, 5 Drawing Sheets

(56) References Cited

U.S. PATENT DOCUMENTS

| | | | | |
|---|---|---|---|---|
| 6,562,467 B2* | 5/2003 | Remmert | ............... | B05D 7/16 |
| | | | | 427/299 |
| 7,732,714 B2* | 6/2010 | Hammaker | ............ | F16J 15/027 |
| | | | | 174/356 |
| 7,978,463 B1* | 7/2011 | Haun | ................. | E04H 5/02 |
| | | | | 312/223.2 |
| 9,185,822 B2* | 11/2015 | Shanbhogue | .......... | H05K 1/144 |
| 9,559,501 B2* | 1/2017 | Lindholm | ................ | H02B 1/28 |
| 9,745,794 B2* | 8/2017 | Ellingson | .............. | E06B 7/2309 |
| 2009/0084782 A1 | 4/2009 | Helmer | | |
| 2012/0275286 A1* | 11/2012 | McGuire, Jr. | ......... | G11B 25/043 |
| | | | | 369/75.11 |
| 2015/0075080 A1* | 3/2015 | Ellingson | .............. | E06B 7/2309 |
| | | | | 49/483.1 |
| 2016/0241002 A1* | 8/2016 | Tremaine | ................ | H02B 1/44 |

\* cited by examiner

METHOD AND SYSTEM FOR ENVIRONMENTAL SEALING OF ELECTRICAL ENCLOSURES

BACKGROUND OF THE INVENTION

Field of the Invention

This application relates to electrical enclosures and more particularly, to environmental sealing of electrical enclosures to protect against ingress of foreign matter.

Background of the Invention

Electrical enclosures take many known forms for housing electrical control devices. An electrical enclosure is a cabinet which mounts such electrical devices and isolates them from users and protects them from the environment. Electrical enclosures are typically made of metal or other materials to form a cabinet having an enclosed space for housing the electrical devices. The enclosed space is accessible via an opening. The opening is selectively closed by a door or cover. The enclosure is manufactured of numerous parts and typically has holes, joints, gaps, seams and/or fasteners.

Underwriters Laboratory (UL), the National Electrical Manufacturers Association ("NEMA"), and the International Electromechanical Commission ("IEC") define various standards for electrical enclosures used in industrial applications. The enclosures are rated by these standards organizations to indicate they are designed to protect against various factors including environmental conditions.

Electrical enclosures are typically designed and sealed for a specific environmental protection level, such as an International Protection rating, or IP-rating, established by the IEC, which relates specifically to keeping foreign matter out of the enclosed space. If these enclosures are not properly sealed, and debris or water can make contact with live electrical components, then the risk of catastrophic failure and bodily harm may increase.

Traditional enclosure design leverages a combination of welded joints, gaskets, and/or seam-sealants to achieve the desired environmental protection level, such as IP56 (limited dust ingress protection and protection against water spray from any direction) or IP67 (total dust ingress protection and protection against liquid immersion up to 1 m in depth).

Welding is often the primary process for creating a sealed space. A welded enclosure often requires additional grinding and finishing operations to attain quality aesthetics. Welding and grinding are labor intensive, error-prone processes, when compared to alternative joining methods, such as bolting and riveting. Welding is chosen over bolted or riveted joints, as neither bolts nor rivets are able to seal a void on their own.

When bolts and/or rivets are selected for joining an enclosure, they must be used in conjunction with mechanical or chemical sealants to environmentally protect the enclosed space. Rubber or foam gasket material, or liquid sealants must be placed inside a void, or between joining panels to seal that area. Gaskets and liquid sealants must be compressed in a controlled manner to ensure proper sealing. Controlling the compression often requires a large number of fasteners if the enclosure material properties do not exhibit high enough stiffness.

These traditional designs are often coated with various thin-film coatings such as liquid epoxy paint or polyester powder coat. These coating thicknesses typically do not exceed 0.25 mm. The thin-film coatings are often relied on for corrosion protection, aesthetics, and/or abrasion resistance. These coatings must also be applied before the enclosure is populated with electronics. Ultimately, thin-film coatings do not provide any significant means towards sealing an enclosure against environmental contamination

SUMMARY OF THE INVENTION

In accordance with one aspect there is disclosed herein a method of sealing an electrical enclosure against environmental contamination comprising: providing a cabinet having an interior space for housing electrical control devices, the cabinet being manufactured of numerous parts and having holes, joints, gaps, seams and/or fasteners; and applying a thick-film elastomeric coating to the enclosure, the coating having a thickness of at least 0.6 mm, to provide a monolithic bridging layer over holes, joints, gaps, seams and/or fasteners for ingress protection to prevent environmental contamination from penetrating the electrical enclosure.

It is a feature that the coating prevents ingress of dust and liquids. The coating may conform to the International Protection Rating of IP56 or IP67.

It is another feature that the coating is formed of 100 percent solids. The coating may be composed of polyurethane, polyaspartic, or polyurea based elastomeric materials.

It is an additional feature that the coating is applied via an elevated temperature, two-component system comprising resin and catalyst.

It is another feature that the coating thickness is at least 0.6 mm.

It is a further feature to use back masking of any holes, joints, gaps or seams, larger than approximately 7 mm.

It is yet another feature that the enclosure comprises a door or cover and further comprising removing the door or cover and masking the door or cover opening prior to applying the coating.

There is disclosed in accordance with another aspect an electrical enclosure sealed against environmental contamination. An enclosure cabinet has an interior space. The interior space is accessible through an opening. A door or cover selectively closes the opening. The cabinet is manufactured of numerous parts and has holes, joints, gaps, seams and/or fasteners. Electrical control devices are mounted in the cabinet. A thick-film elastomeric coating is on an outer surface of the cabinet. The coating has a thickness of at least 0.6 mm to provide a monolithic bridging layer over holes, joints, gaps, seams and/or fasteners to prevent environmental contamination from penetrating the enclosure.

Thick-film coatings can be applied to electrical enclosures to provide a means of sealing them against environmental contamination. Because the coating has the ability to bridge gaps and seams, traditional welded or filled joints are no longer required. Bridging these voids also eliminates the need to apply gasket to permanently secured joints. Simple bolt and rivet designs can be employed for structural strength, and the coating can be completely relied upon to seal the enclosure.

Further features and advantages will be readily apparent from the specification and the drawings.

DETAILED DESCRIPTION OF THE INVENTION

Figure 1:
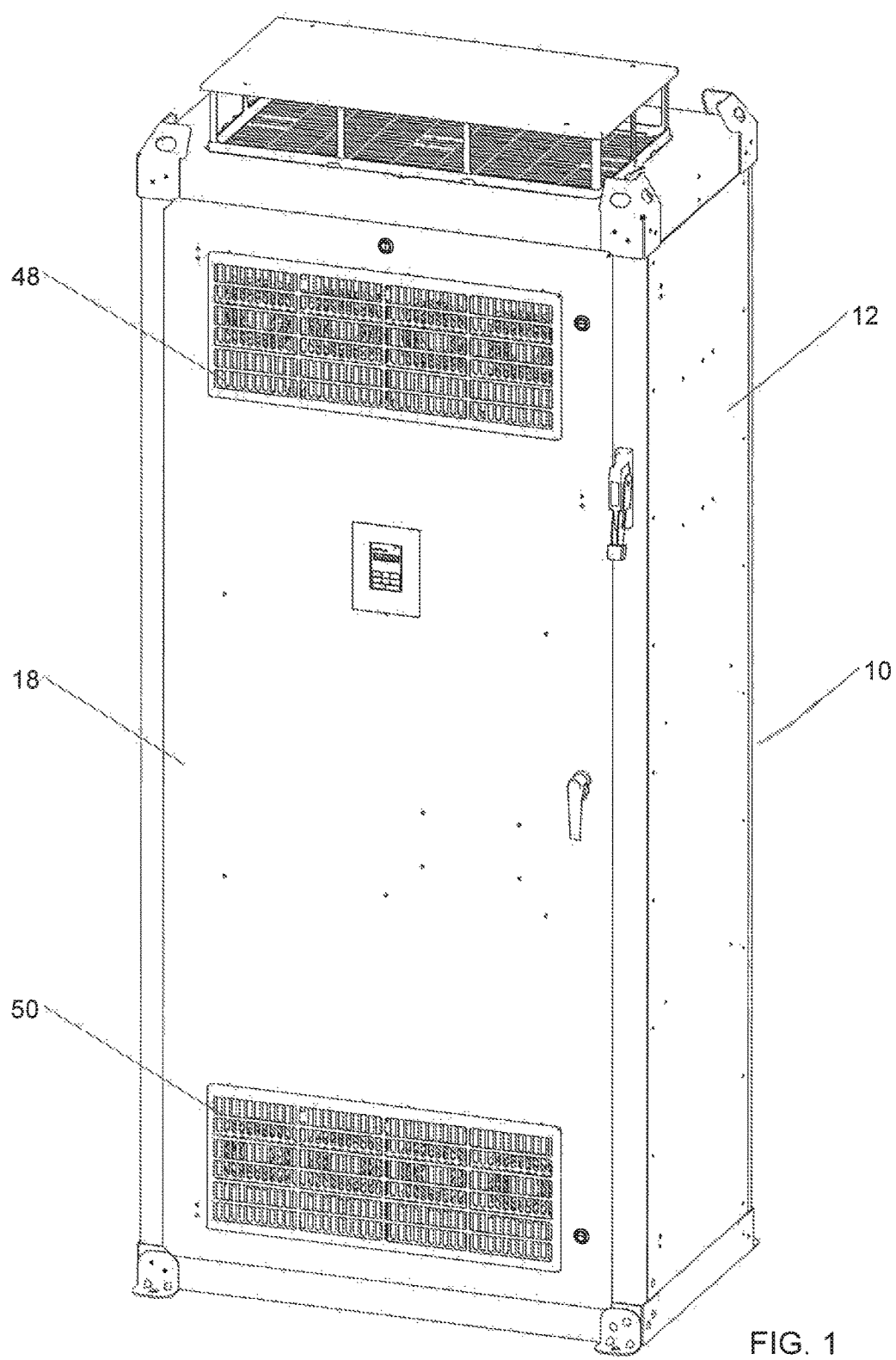
FIG. 1 is an isometric view of a typical electrical enclosure constructed of a simple bolt and/or rivet design.

This application relates to systems and methods for providing a thick-film environmental sealing of electrical enclosures. Referring initially to FIG. 1, an exemplary electrical enclosure 10 is illustrated. The electrical enclosure 10 is constructed of a simple bolt and rivet design. The electrical enclosure 10 is one example of an enclosure which can receive the environmental sealing. However, the application is not limited to the form of the electrical enclosure shown herein.

The electrical enclosure 10 comprises a cabinet 12 formed of various parts of metal and/or other materials joined by bolts and/or rivets and having holes, joints, gaps, seams and/or fasteners. The cabinet 12 has an enclosed interior space 14, see FIG. 3, accessible through an opening 16. A door 18, see FIG. 1, selectively closes the opening 16. As will be apparent, while a door 18 is illustrated, the opening 16 could be closed by a cover depending on the application. Various electrical control devices 20 are mounted in the interior space in any known manner.

Figure 2:
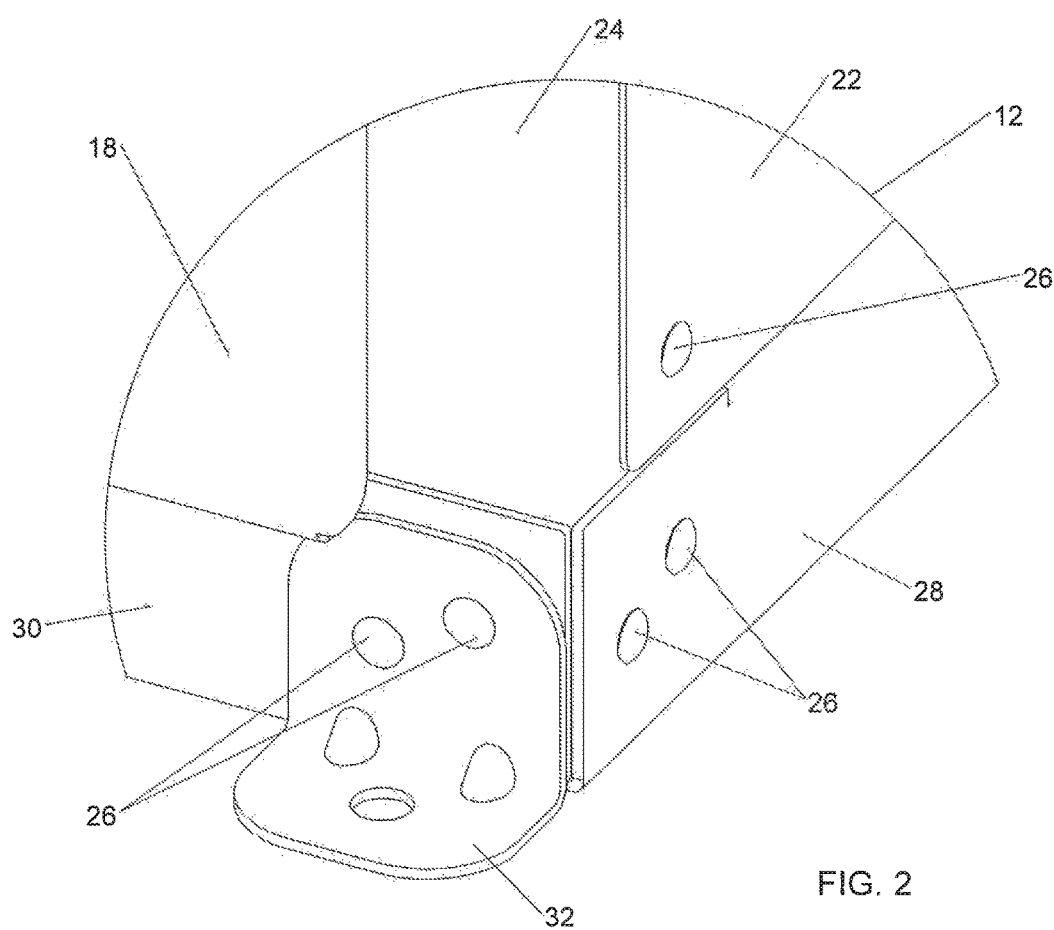
FIG. 2 is an isometric view of a typical fastened joint configuration in an electrical enclosure, over which a thick-film coating may be applied.

FIG. 2 illustrates the front lower right corner of the enclosure 10 showing exemplary parts used in the manufacture of the cabinet 12. A side panel 22 is mounted to a corner piece 24 using fasteners 26. A side bottom angle bracket 28 is mounted to the corner piece 24 using fasteners 26. A front bottom bracket 30 is mounted to the corner piece 24 as is a mounting foot 32 using fasteners 26. The door 18 is hingedly mounted to the cabinet 12 in any known manner. The fasteners 26 may be bolts, rivets, or any other coupling mechanism, as desired.

As is apparent, the cabinet 12 has various places where the panels and brackets and the like abut or overlap to provide joints, gaps or seams and likewise have holes for receiving the various fasteners, only some of which are illustrated. Other holes or openings may be provided in the cabinet to facilitate mounting of the devices 20 in the interior space 14. As can also be seen in FIG. 3, the panel has numerous other opening and/or fasteners. Any of these holes, joints, gaps, seams and/or fasteners provide spaces through which dust, water and the like can find its way into the interior space 14 of the cabinet 12.

Cabinets are defined by the IEC to have International Protection ratings, discussed above, based on the ability of the cabinets to protect against ingress. The rating includes the letters "IP" along with two digits, one representing the level of protecting against the ingress of solid foreign objects and the second against harmful ingress of water.

As described herein, the cabinet 12 and/or the door 18 includes a thick-film of elastomeric coating on an outer surface to prevent environmental contamination from penetrating the enclosure. Advantageously, the coating conforms to at least the International Protection Rating of IP56 (limited dust ingress protection and protection against water spray from any direction) or more advantageously a rating of IP67 (total dust ingress protection and protection against liquid immersion up to 1 m in depth).

The coating may also conform with one of UL rating of type 3 (to provide a degree of protection against falling dirt, rain, sleet, snow, and windblown dust; and that will be undamaged by the external formation of ice on the enclosure); UL rating of type 6 (to provide a degree of protection against falling dirt, rain, sleet, snow, hose-directed water and the entry of water during occasional temporary submersion at a limited depth; and that will be undamaged by the external formation of ice on the enclosure) or UL rating of type 13 (to provide a degree of protection against falling dirt; against circulating dust, lint, fibers, and flyings; and against the spraying, splashing, and seepage of water, oil, and non-corrosive coolants).

Figure 3:
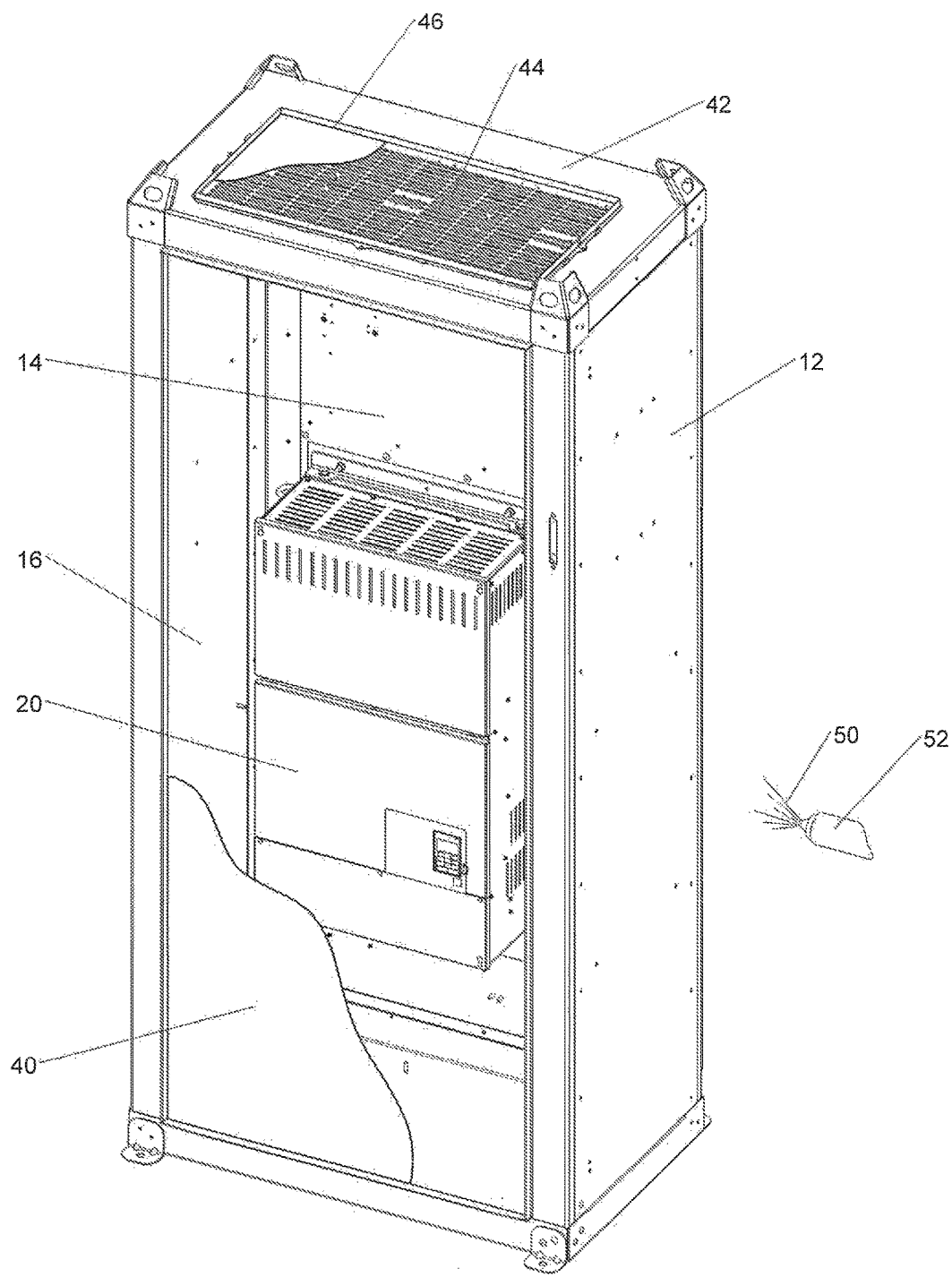
FIG. 3 is an isometric view, similar to FIG. 1, illustrating the use of masking over a door opening and over a top vent, and the application of a thick-film coating.

Prior to application of the coating, the door 18 is removed from the cabinet 12, see FIG. 3. If the control devices 20 are preinstalled in the cabinet 12, as shown, then the front opening 16 is covered by a mask 40. Similarly, the illustrated cabinet 12 has a top wall 42 including a vent 44. During application of the coating, a mask 46 is used to cover the vent 44. The masks 40 and 46 may be formed of any known material to prevent the coating material from entering the interior space 14 or coating and thus sealing the vent 44. Masks may additionally be applied in any other location as functionally required.

As is apparent, the vent 44 and likewise vents 48 and 50 in the door 18, see FIG. 1, would be provided with filters and the like, as necessary, to provide the appropriate environmental protection. As is also apparent, not all enclosures include such venting.

An elastomeric thick-film coating is applied to the cabinet 12 by spraying the elastomeric material 50 from a nozzle 52, see FIG. 3. The coating is applied over the entirety of the cabinet 12. While not shown, the door 18 would be similarly coated, if necessary.

Figure 4:
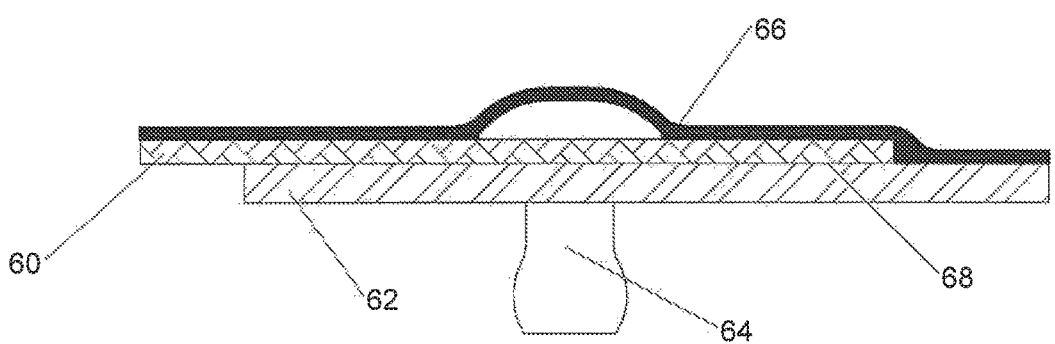
FIG. 4 is a cross-section view of a typical fastened joint with a thick-film coating applied.

FIG. 4 illustrates a portion of the cabinet 12 in which a first panel 60 overlaps a second panel 62 and which are fastened together using one or more rivets 64. This structure includes an elastomeric coating 66 which provides a monolithic bridging layer over the fastener 64 and a joint 68 between the panels 60 and 62. The coating 66 prevents environmental contaminants from penetrating the enclosure.

Figure 5:
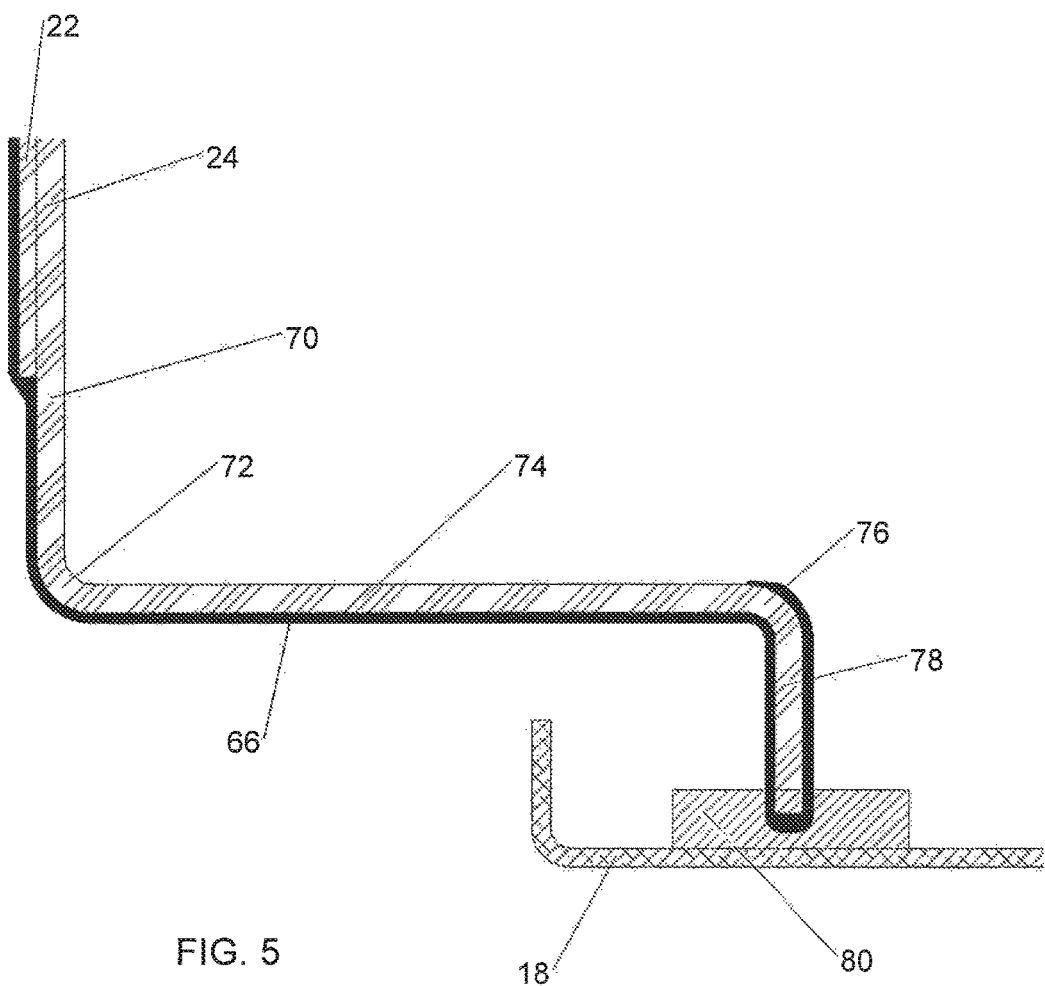
FIG. 5 is a cross-section of a typical access point into an electrical enclosure, with a thick-film coating applied.

FIG. 5 illustrates the corner piece 24 which has a side wall portion 70, turned at a corner 72 to a front wall portion 74, and turned outwardly at 76 to form a flange 78. The coating 66 covers the outer surface of the side wall 22 and corner piece 24. The interior surfaces of the cabinet 12 are not covered by the coating 66, except for the flange 78, due to use of the mask 40, see FIG. 3. A conventional gasket 80 is secured to the door 18 for providing a seal between the door 18 and the flange 78.

Thick-film coatings, such as the coating 66, may be composed of polyurethane, polyaspartic, or polyurea based elastomeric materials. The thick-film coatings have a thickness of at least 0.6 mm, to provide a monolithic bridging layer over holes, joints, gaps, seams and/or fasteners for ingress protection. Examples of such coatings include the XS-650 elastomer coating system of Line-X LLC and the SolarMax® 11-65 elastomer coating system of Rhino Linings Corporation.

Thick-film coatings are typically applied via an elevated temperature, two-component system, comprising resin and catalyst, and cured via a chemical reaction in seconds or minutes without any external stimulus. This rapid cure time allows the coating to be applied in any orientation and in thicknesses exceeding 0.6 mm, with minimal risk of drips or sags. It can also be applied in multiple layers over a period of time to build a nearly limitless thickness. Thick-film coatings have adhesion levels that often exceed that of epoxy paints and powder coats, even on low surface-energy substrates. The thick-film coatings are most commonly composed of 100 percent solids and emit zero volatile organic compounds.

The method by which the thick-film coating 66 is applied is important to the function, as well as the aesthetic, of the finished product. The coating may be applied over a number of surfaces, including but not limited to steel, galvanized steel, aluminum, polyurethane sealants, and a number of adhesive-back tapes. Care must be taken to ensure proper bond strength is achieved on the primary bonding substrate. Thorough cleaning of the substrate is critical to ensuring the long-term performance of the thick-film coating, just as it is to that of paint and powder-based coatings.

The coating 66 is applied to a minimum thickness of 0.6 mm, and has structural properties similar to many engineering grade polymers. The polymer-like strength and flexibility allows it to move and flex across joints as the enclosure moves, vibrates, expands, and contracts.

Thick-film coatings can be applied with any surface finish, from a glossy smooth orange-peel appearance all the way up to a course texture similar to that of a popcorn ceiling.

Thick-film coatings can often bridge small gaps on their own. Back-masking by any traditional means prior to applying the coating is generally required for any larger openings. Gaps with minor dimensions greater than approximately 7 mm generally require back-masking, but this requirement can vary depending on the coating process and ingress protection requirements of the enclosure. The thick-film forms a monolithic layer similar to that of a polymer sheet, even in areas supported only by back-masking.

In a sealing application, the thick-film coating 66 must be properly layered in such a way to form a monolithic bridging layer over gaps, holes and other voids. This layering also improves long-term adhesion properties. The thickness of the thick-film coating varies based on the maximum dimensions of the void being filled.

Traditional gasket material can be used anywhere access into the enclosure 10 is required, such as the door 18. For example, the primary access door 18 may have the gasket 80 applied to the door 18, see FIG. 5, which is pressed against the standing flange 78 to create a seal. The flange 78 may be completely encapsulated with the coating 66, but does not impact the seal between the door 18 and the cabinet 12. The thick-film coating 66 is permanent, meaning that it can only be removed or modified with destructive means that may compromise the environmental protection of the enclosure 10.

The thick-film coating texture must be carefully selected to maintain a surface to which traditional gasket and sealant materials will still conform. In an electronics enclosure, conduit fittings are almost always compressed against the exterior surface of the enclosure to pass wiring in and out of the space. The texture must be such that it conforms to the seals incorporated into said conduit fittings.

Thick-film coatings are 100 percent solids, and as such, they can be applied to an electrical enclosure after it is populated with components without the risk of damaging any sensitive electronics within those components. The thick-film coating is easily controlled with traditional masking, discussed above, which prevents entry into the enclosed space. Application of the thick-film coating post-assembly allows for unparalleled manufacturing flexibility, and late-cycle modification that is not generally possible with other coatings. Additionally, should the thick-film coating become damaged, it may be repaired by techniques similar to those described previously, without risk of damaging any internal components.

Thus, as described, the electrical enclosure 10 includes a thick-film elastomeric coating to provide environmental sealing to protect against ingress of dust and water.

It will be appreciated by those skilled in the art that there are many possible modifications to be made to the specific forms of the features and components of the disclosed embodiments while keeping within the spirit of the concepts disclosed herein. Accordingly, no limitations to the specific forms of the embodiments disclosed herein should be read into the claims unless expressly recited in the claims. Although a few embodiments have been described in detail above, other modifications are possible. Other steps may be provided, or steps may be eliminated, from the described methods, and other components may be added to, or removed from, the described systems. Other embodiments may be within the scope of the following claims.

The foregoing disclosure of specific embodiments is intended to be illustrative of the broad concepts comprehended by the invention.

The invention claimed is:

1. A method of sealing an electrical enclosure used in industrial applications against environmental contamination comprising:
    providing a cabinet having an interior space for housing electrical control devices, the cabinet being manufactured of numerous parts and having holes, joints, gaps, seams and/or fasteners, the cabinet having an opening providing access to the interior space and electrical control devices housed therein, in use of the cabinet, the opening being selectively closable by a closure; and
    applying a thick-film elastomeric coating to the cabinet, with the closure removed, the coating having a thickness of at least 0.6 mm, to provide a monolithic bridging layer over holes, joints, gaps, seams and/or fasteners for ingress protection to prevent environmental contamination from penetrating the electrical enclosure.

2. The method of claim 1 wherein the coating prevents ingress of dust and liquids.

3. The method of claim 1 wherein the coating is formed of 100 percent solids.

4. The method of claim 1 wherein the coating is applied via an elevated temperature, two-component system comprising resin and catalyst.

5. The method of claim 1 wherein the coating is composed of polyurethane, polyaspartic, or polyurea based elastomeric materials.

6. The method of claim 1 further comprising back masking holes, joints, gaps or seams.

7. The method of claim 1 wherein the coating conforms with International Protection rating of IP56.

8. The method of claim 1 wherein the coating conforms with the Underwriters Laboratory rating of Type 3.

9. The method of claim 1 wherein the coating conforms with the Underwriters Laboratory rating of Type 6.

10. The method of claim 1 wherein the coating conforms with the Underwriters Laboratory rating of Type 13.

11. The method of claim 1 wherein the coating conforms with International Protection rating of IP67.

12. The method of claim 1 further comprising masking the opening prior to applying the coating.

\* \* \* \* \*